US 6,744,117 B2

(12) United States Patent
Dragon et al.

(10) Patent No.: US 6,744,117 B2
(45) Date of Patent: Jun. 1, 2004

(54) HIGH FREQUENCY SEMICONDUCTOR DEVICE AND METHOD OF MANUFACTURE

(75) Inventors: Christopher P. Dragon, Tempe, AZ (US); Wayne R. Burger, Phoenix, AZ (US); Daniel J. Lamey, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 44 days.

(21) Appl. No.: 10/086,061

(22) Filed: Feb. 28, 2002

(65) Prior Publication Data

US 2003/0160324 A1 Aug. 28, 2003

(51) Int. Cl.[7] .............................................. H01L 23/552
(52) U.S. Cl. ........................ 257/659; 257/340; 438/731
(58) Field of Search ................................. 257/659, 660, 257/662, 508, 340; 438/731

(56) References Cited

U.S. PATENT DOCUMENTS

| 4,121,240 A | * | 10/1978 | Katto |
| 4,805,138 A | * | 2/1989 | McElroy et al. |
| 4,926,243 A | * | 5/1990 | Nakagawa et al. |
| 4,984,200 A | * | 1/1991 | Saitoo et al. |
| 5,070,378 A | * | 12/1991 | Yamagata |
| 5,578,860 A | * | 11/1996 | Costa et al. |
| 5,801,091 A | | 9/1998 | Efland |
| 6,107,160 A | * | 8/2000 | Hebert et al. ................ 438/454 |
| 6,150,722 A | | 11/2000 | Efland |
| 6,318,622 B1 | | 11/2001 | Hollingsworth |

OTHER PUBLICATIONS

International Search Report.

* cited by examiner

*Primary Examiner*—Sheila V. Clark
(74) *Attorney, Agent, or Firm*—Patricia S. Goddard

(57) ABSTRACT

A semiconductor device (10) having a gate (15), a source (19), and a drain (20) with a gate bus (25) and first ground shield (24) patterned from a first metal layer and a second ground shield (31) patterned from a second metal layer. The first ground shield (24) and the second ground shield (31) lower the capacitance of device (10) making it suitable for high frequency applications and housing in a plastic package.

25 Claims, 2 Drawing Sheets

HIGH FREQUENCY SEMICONDUCTOR DEVICE AND METHOD OF MANUFACTURE

BACKGROUND OF THE INVENTION

This invention relates, in general, to semiconductor devices, and more particularly, to a structure and a method of manufacturing a Laterally Diffused Metal-Oxide Semiconductor (LDMOS) device.

Semiconductor devices that are used in applications such as cellular base stations are required to operate at high frequencies. For these types of applications, Radio Frequency (RF) LDMOS power transistors are attractive because they provide good performance at frequencies in a range from 100 MHz to about 2 GHz.

RF LDMOS devices have been traditionally packaged in expensive metal/ceramic packages for thermal reasons. However, for certain low-to-medium power applications it is desirable to package these devices in plastic packages due to the lower cost of plastic encapsulation processes. In addition, plastic package technology has improved recently, and can now be used for packaging devices that are used in higher power applications.

The plastic mold compound comprising the plastic package causes certain parasitic capacitances within the device to increase and renders the device unacceptable for use in the GHz frequency ranges, where capacitance of the device becomes critical. The capacitances in the device are parasitics that can degrade RF performance metrics such as power gain and drain efficiency.

Accordingly, there is a need to provide an LDMOS device, particularly an RF LDMOS device that is designed for high frequency applications, that has low capacitance when packaged in a plastic package.

DETAILED DESCRIPTION OF THE PREFERRED EMBODIMENTS

Generally, the present invention provides a design and method for forming a semiconductor device that has low capacitance even when housed in a plastic package that is particularly useful in high frequency applications. In particular, a laterally diffused metal-oxide semiconductor (LDMOS) device design utilizing a first and a second ground shield provides for low parasitic capacitance.

Figure 1:
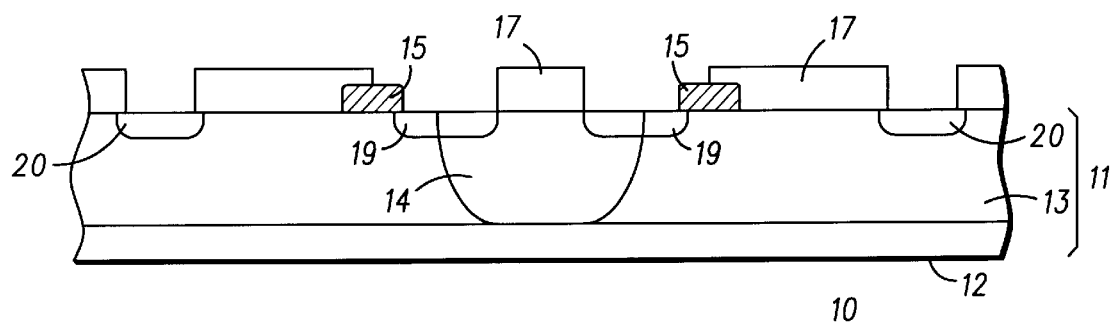
FIG. 1 illustrates a cross-sectional view of a portion of a device in a beginning stage of fabrication in accordance with the present invention.

FIG. 1 illustrates a portion of an enlarged, cross-sectional view of an embodiment of a device 10 in a beginning stage of fabrication in accordance with the present invention. A simplified version of an LDMOS device is described and illustrated in order to allow a greater focus on the novel features of the invention, which relate to the design of a gate bus and a ground shield formed in a first metal layer and a ground shield formed in a second metal layer, as will be described in further detail below. The structure and process of forming an LDMOS device, without the novel features of the present invention, has been described in U.S. Pat. No. 5,578,860, issued to Costa et al. and assigned to the same assignee as the present invention, Motorola, Inc., and is hereby incorporated by reference.

Still with reference to FIG. 1, device 10 includes a semiconductor body 11. Semiconductor body 11 is preferably of a P-type silicon material and typically includes a P+ doped substrate 12 and a lightly doped P− epitaxial layer 13 formed over a P+ doped substrate 12. A sinker region 14 is formed by photolithography, ion implantation, and diffusion/annealing techniques into P− doped epitaxial layer 13 at least down to P+ doped substrate 12. Sinker region 14 is heavily doped (P+ type) to form a low resistance path for backside connection (from the outer surface of P+ doped substrate 12) to the source region 19 (to be described below).

A gate structure 15 is then formed over semiconductor body 11. Gate structure 15 is shown in a highly simplified fashion for illustrative convenience. Gate structure 15 is comprised of a gate dielectric layer and a gate electrode (not separately shown). Preferably, the gate electrode is comprised of a heavily doped polycrystalline semiconductor layer and a gate ohmic or metal layer formed on the polycrystalline semiconductor layer. Preferably, the gate metal layer is comprised of a tungsten/silicon alloy, however, other metals are suitable, including titanium, titanium-nitride, molybdenum, or the like. The polycrystalline semiconductor layer is typically doped N-type.

A masking layer or photoresist layer 17 is then formed and patterned over device 10 to leave openings for forming source region 19 and drain regions 20, which are both N-type doped regions. Preferably, source region 19 and drain regions 20 are formed by selectively ion implanting arsenic in the openings of photoresist layer 17 into semiconductor body 11. The ion implantation is conventionally followed by an anneal process. A portion of gate structure 15 also acts as a mask so that source region 19 is formed to be self aligned to one side of gate structure 15. Drain regions 20 are formed in semiconductor body 11 on the other side of gate structure 15 that source region 19 is formed.

Figure 2:
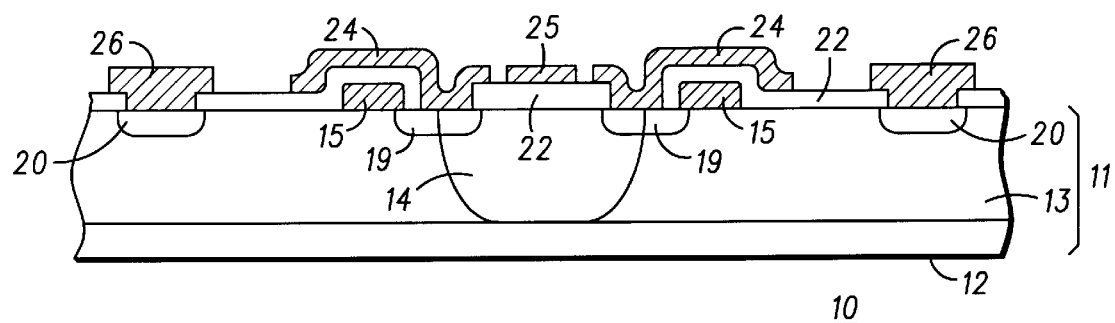
FIG. 2 illustrates a cross-sectional view of the device of FIG. 1 further along in processing in accordance with the present invention.

FIG. 2 illustrates the device of FIG. 1 further along in processing. Here, photoresist layer 17 has been removed and a first interlevel dielectric layer (ILD0 layer) 22 is formed over the upper surface of device 10 and patterned with openings made over source region 19 and drain regions 20, as shown in FIG. 2. In the present invention a portion of ILD0 layer 22 is left over a portion of source region 19 and over sinker region 14. Conventional photoresist and etching techniques are used to provide the openings in ILD0 layer 22.

Preferably, ILD0 layer 22 is comprised of a silicate glass layer. In particular, the silicate glass layer may be comprised of an undoped silicate glass (USG) deposited first, a phosphosilicate glass (PSG) deposited over the USG, and a second layer of USG deposited over the PSG, with the USG/PSG/USG having a total thickness in a range from 3,000 to 20,000 angstroms. The USG/PSG/USG layers are deposited using conventional chemical vapor deposition (CVD) techniques. The use of a PSG layer provides for gettering of any impurities that may be present in the silicate glass.

Still with reference to FIG. 2, a first ohmic or metal layer is formed over the surface of device 10 and patterned to provide a first ground shield 24, a gate bus 25, and first drain contacts 26. The first metal layer preferably has a thickness in range from 1.0 to 1.5 microns. The first metal layer is typically comprised of aluminum, an aluminum alloy, or a multi-layer metallization such as a titanium-tungsten alloy layer followed by an aluminum-copper alloy layer.

For example, the first metal layer which comprises first ground shield 24, gate bus 25, and drain contact 26, may be comprised of aluminum or an alumimun alloy such as an an aluminum copper tungsten alloy (AlCuW) to provide a low resistivity metallization. Alternatively, the first metal layer may be comprised of a 750 to 3,000 angstrom titanium-tungsten (TiW) barrier metal layer and at least a 1.0 micron aluminum alloy (e.g., AlCu) layer over the TiW layer. Preferably, the total thickness of the first metal layer is between 5,000 and 30,000 angstroms.

Preferably, conventional sputtering techniques are used to form the first metal layer. Photoresist and etching techniques are used to define a source contact or first ground shield 24, gate bus 25, and first drain contacts 26 therefrom.

Source contact or first ground shield 24 is in electrical contact with source region 19. First ground shield 24 overlies gate structure 15, which reduces the parasitic capacitance between the drain region 20 (including first drain contact 26 and a second drain contact 33, as shown and described in FIG. 3) and the gate structure 15. In this embodiment, first ground shield 24 is formed overlying gate structure 15 and over ILD0 layer 22. However, first ground shield 24 may be formed over a portion of ILD0 layer 22 and not extending over gate structure 15 to act as a source contact 24 only. That first ground shield 24 overlie gate structure 15 is not necessary to achieve the benefits of the present invention, because a second ground shield 31 will be formed, as discussed below with reference to FIG. 3. Gate bus 25 is formed over ILD0 layer 22 in between fingers of gate structure 15. Each drain contact 26 makes electrical contact to a drain region 20.

Figure 3:
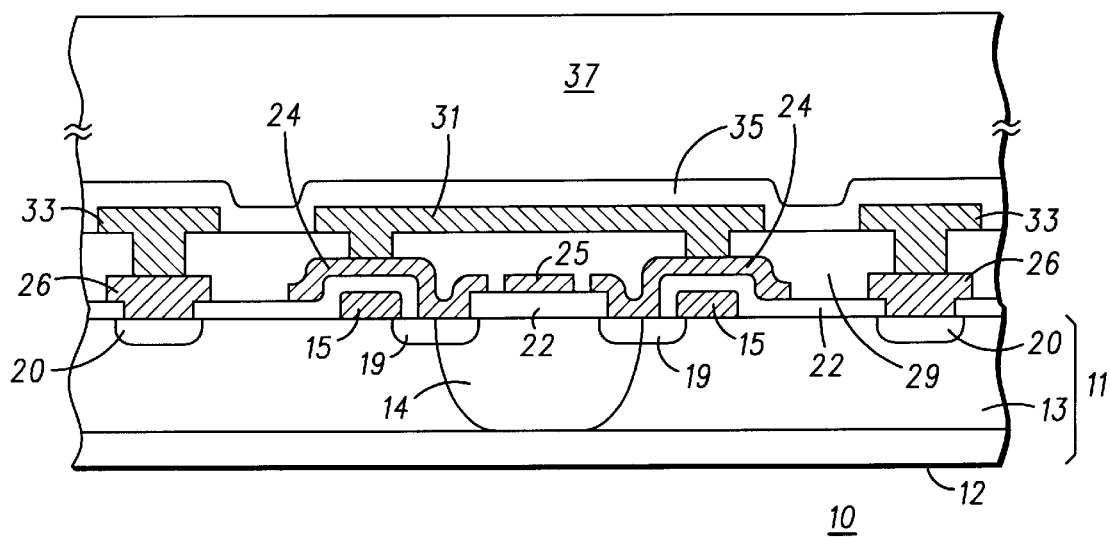
FIG. 3 illustrates a cross-sectional view of the device of FIG. 2 further along in processing in accordance with the present invention.

Turning now to FIG. 3, a second interlevel dielectric layer (ILD1 layer) 29 is formed over ILD0 layer 22, gate bus 25, first ground shield 24 and drain contacts 26. ILD1 layer 29 is preferably comprised of silicon dioxide (a plasma-enhanced CVD (PECVD) silicon dioxide is suitable) having a thickness in the range of 0.5–4.0 microns. It is desirable for ILD1 layer 29 to be planar, so it is preferable to deposit a silicon dioxide in two steps, with a planarization step in between the two depositions.

Still with reference to FIG. 3, conventional photolithography and etch techniques are used to form contact openings or vias in ILD1 layer 29. A second ohmic or metal layer is formed over ILD1 layer 29 and in contact openings or vias in ILD1 layer 29 and patterned to define a second ground shield 31 and second drain contacts 33. Preferably, the second metal layer is comprised of aluminum or an aluminum alloy, most preferably an AlCuW alloy having a thickness in range of approximately 5000 to 60,000 angstroms. An AlCuW metallization provides enhanced protection against electromigration related failures.

Second ground shield 31 is formed overlying gate bus 25 and overlying source region 19 and is electrically coupled to first ground shield 24. Second ground shield 31 overlies gate bus 25, thereby further reducing drain-gate capacitance. Forming gate bus 25 from the first metal layer (rather than from the second metal layer) allows the second ground shield 31 to be created over the gate bus 25 further reducing the capacitance of the device. Second drain contacts 33 are electrically coupled to first drain contacts 26 and are formed to provide bond pad areas.

Figure 4:
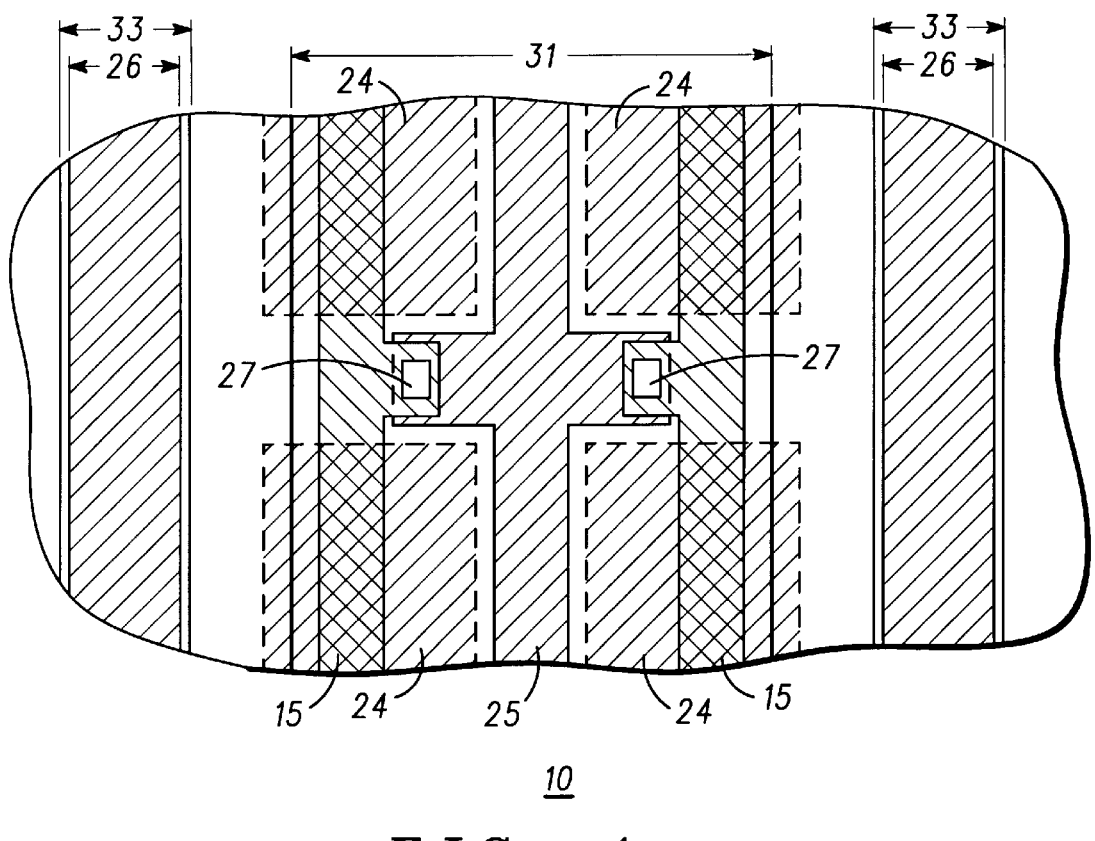
FIG. 4 illustrates a top layout view of the device of FIG. 3.

Now with reference to FIG. 4, which illustrates a top layout view of FIG. 3, one can see how gate bus 25 is formed in between fingers of gate structure 15 and runs parallel to fingers of gate structure 15. Gate bus 25 periodically is electrically coupled to gate structure 15 at contact areas 27 so that the gate resistance (Rg) is kept low enough so as not to degrade the power gain of device 10.

Now with reference back to FIG. 3, processing of device 10 is finalized by forming a passivation layer 35 over device 10. Passivation layer 35 is preferably comprised of a phospho-silicoate glass (PSG) and a PECVD silicon dioxide/silicon nitride film combination formed on the PSG layer. Subsequently, device 10 is encapsulated in a plastic package 37 using conventional packaging techniques. Plastic package 37 is comprised of a mold compound. It should be noted that the mold compound of plastic package 37 is formed in between second source contact/second ground shield 31 and drain contact 33. The plastic comprising plastic package 37 contributes to the capacitance between drain region 20 (including first drain contact 26 and second drain contact 33) and gate bus 25.

Although only a portion of an LDMOS device is shown, it is understood that a device incorporating a plurality of the above structures forms an LDMOS device. Typically, LDMOS structure 10 is designed in an interdigitated fashion with alternating source regions 19 and drain regions 20. The gate structure 15 and drain region 20 finger lengths can be up to 300 to 1000 microns. Further, the LDMOS device may be integrated with passive devices (such as resistors, capacitors and inductors) and other active devices (such as logic devices), and such an integrated circuit is within the scope of the present invention.

Furthermore, although an N-channel LDMOS structure is described above, the structures and methods in accordance with the present invention support a P-channel LDMOS structure with the N and P type dopants switched.

By now it should be appreciated that there has been provided structures and methods for an LDMOS device in a plastic package which has low capacitance, which is particularly advantageous for high frequency applications. The structures and methods utilize a gate bus 25 and a first ground shield 24 defined from a first metal layer and a second ground shield 31 defined from a second metal layer which is overlying gate bus 25. The first ground shield 24 and the second ground shield 31 act to reduce the gate-drain capacitance. The LDMOS of the present invention provides good performance in high frequency applications and is significantly lower cost than an LDMOS device packaged in a conventional metal/ceramic package.

Thus, a design and process for an LDMOS device, which fully meets the advantages set forth above, has been provided. Although the invention has been described and illustrated with reference to specific illustrative embodiments, it is not intended that the invention be limited to those illustrative embodiments. Those skilled in the art will recognize that variations and modifications can be made without departing from the spirit of the invention. Therefore, all such variations and modifications as fall within the scope of the appended claims and equivalents thereof are intended to be included within the invention.

What is claimed is:

1. A method of making a semiconductor device, comprising the steps of:

provide a semiconductor body;

forming a gate structure over the semiconductor body;

forming a source region and a drain region in the semiconductor body, wherein the source region is adjacent a side of the gate structure and the drain region is adjacent another side of the gate structure;

forming a first dielectric layer over the gate structure and over a portion of the semiconductor body adjacent the source region;

forming a source contact electrically coupled to the source region, the source contact providing a first shield to reduce capacitance between the gate structure and the drain region;

forming a gate bus over the first dielectric layer adjacent the source region;

forming a second dielectric layer over the gate bus and the source contact; and forming a metal layer over a portion of the second dielectric layer over the gate bus and electrically coupled to the source contact.

2. The method of claim 1 wherein the step of forming the first dielectric layer comprises forming the first dielectric layer having a thickness in the range of 3,000 to 20,000 angstroms.

3. The method of claim 1 wherein the step of forming the first dielectric layer comprises forming the first dielectric layer comprised of a silicate glass layer.

4. The method of claim 1 wherein the step of forming the second dielectric layer comprises forming the second dielectric layer having a thickness in the range of 0.5 to 4.0 microns.

5. The method of claim 1 wherein the step of forming the source contact further comprises the source contact providing a first ground shield.

6. The method of claim 1 wherein the step of forming the source contact and forming the gate bus comprises forming the source contact and the gate bus from the same metallization layer.

7. The method of claim 1 wherein the steps of forming the source contact and forming the gate bus are performed at the same time.

8. The method of claim 1 wherein the step of forming the metal layer further comprises the metal layer providing a second shield to reduce capacitance between the gate bus and the drain region.

9. The method of claim 1 wherein the step of forming the source contact further comprises forming the source contact overlying the gate structure.

10. The method of claim 8 wherein the step of forming the metal layer comprises forming the second shield as a ground shield.

11. The method of claim 1 further comprising the step of encapsulating the semiconductor body in a plastic package.

12. A method of making an LDMOS device, comprising the steps of:

providing a semiconductor body;

forming a gate structure over the semiconductor body;

forming a source region and a drain region in the semiconductor body, wherein the source region is adjacent a side of the gate structure and the drain region is adjacent another side of the gate structure;

forming a first interlevel dielectric layer over the gate structure and over a portion of the semiconductor body adjacent the source region;

forming a first ground shield electrically coupled to the source region and overlying the gate structure;

forming a gate bus over the first dielectric layer adjacent the source region;

forming a second interlevel dielectric layer over the gate bus and the first ground shield; and forming a second ground shield over a portion of the second dielectric layer over the gate bus and electrically coupled to the first ground shield.

13. A semiconductor device, comprising:

a semiconductor body;

a gate structure over the semiconductor body;

a source region and a drain region in the semiconductor body, wherein the source region is adjacent a side of the gate structure and the drain region is adjacent another side of the gate structure;

a first dielectric layer over the gate structure and over a portion of the semiconductor body adjacent the source region;

a source contact electrically coupled to the source region;

a gate bus over the first dielectric layer adjacent the source region;

a second dielectric layer over the gate bus and the source contact; and a metal layer over a portion of the second dielectric layer over the gate bus and electrically coupled to the source contact, wherein the metal layer provides a shield which reduces the capacitance between the gate bus and the drain region.

14. The device of claim 13 wherein the source contact is overlying the gate structure.

15. The device of claim 13 wherein the first dielectric layer is comprised of a silicate glass layer having a thickness in the range of 3,000 to 20,000 angstroms.

16. The device of claim 13 wherein the source contact and the gate bus are comprised of the same metalization.

17. The device of claim 13 wherein the source contact, the metal layer, and the gate bus are comprised of aluminum.

18. The device of claim 13 further comprising a plastic encapsulating the semiconductor device.

19. The device of claim 13 wherein further the source contact is also forms shield which reduces capacitance between the gate structure and the drain region.

20. A method of making a semiconductor device, comprising the steps of:

providing a semiconductor body;

forming a gate structure over the semiconductor body;

forming a source region and a drain region in the semiconductor body, wherein the source region is adjacent a side of the gate structure and the drain region is adjacent another side of the gate structure;

forming a first dielectric layer over the gate structure and over a portion of the semiconductor body adjacent the source region;

forming a source contact electrically coupled to the source region;

forming a gate bus over the first dielectric layer adjacent the source region;

forming a second dielectric layer over the gate bus and the source contact; and forming a metal layer over a portion of the second dielectric layer over the gate bus and electrically coupled to the source contact, the metal layer providing a shield to reduce capacitance between the gate bus and the drain region.

21. The method of claim 20 wherein the step of forming the source contact further comprises the source contact also providing a shield to reduce capacitance between the gate structure and the drain region.

22. The method of claim 20 wherein the step of forming the source contact and forming the gate bus comprises forming the source contact and the gate bus from the same metallization layer.

23. The method of claim 20 wherein the steps of forming the source contact and forming the gate bus are performed at the same time.

24. The method of claim 20 wherein the step of forming the source contact further comprises forming the source contact overlying the gate structure.

25. The method of claim 20 wherein the step of forming a metal layer comprises providing the shield as a ground shield.

* * * * *

UNITED STATES PATENT AND TRADEMARK OFFICE
CERTIFICATE OF CORRECTION

| | | |
|---|---|---|
| PATENT NO. | : 6,744,117 B2 | Page 1 of 1 |
| APPLICATION NO. | : 10/086061 | |
| DATED | : February 28, 2002 | |
| INVENTOR(S) | : Christopher Paul Dragon | |

It is certified that error appears in the above-identified patent and that said Letters Patent is hereby corrected as shown below:

In Column 6, Line 22, First Line of Claim No. 19:

Delete the word "further"

In Column 6, Line 23, Second Line of Claim No. 19:

Delete the word "is"

In Column 6, Line 23, Second Line of Claim No. 19:

Between the words "forms" and "shield" Add the word --a--

Signed and Sealed this

Twenty-seventh Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 6,744,117 B2 Page 1 of 1
APPLICATION NO. : 10/086061
DATED : June 1, 2004
INVENTOR(S) : Christopher Paul Dragon It is certified that error appears in the above-identified patent and that said Letters Patent is hereby corrected as shown below:

In Column 6, Line 22, First Line of Claim No. 19:

Delete the word "further"

In Column 6, Line 23, Second Line of Claim No. 19:

Delete the word "is"

In Column 6, Line 23, Second Line of Claim No. 19:

Between the words "forms" and "shield" Add the word --a--

This certificate supersedes the Certificate of Correction issued November 27, 2007.

Signed and Sealed this

Twenty-ninth Day of January, 2008

JON W. DUDAS
*Director of the United States Patent and Trademark Office*